(12) United States Patent
Sansom et al.

US007955644B2

(10) Patent No.: US 7,955,644 B2
(45) Date of Patent: Jun. 7, 2011

(54) METHOD FOR SELECTIVELY ANCHORING LARGE NUMBERS OF NANOSCALE STRUCTURES

(75) Inventors: Elijah Sansom, Los Angeles, CA (US); Derek Rinderknecht, Arcadia, CA (US); Morteza Gharib, San Marino, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/827,169

(22) Filed: Jul. 10, 2007

(65) Prior Publication Data

US 2008/0145616 A1 Jun. 19, 2008

Related U.S. Application Data

(60) Provisional application No. 60/819,872, filed on Jul. 10, 2006.

(51) Int. Cl.
*B05D 7/00* (2006.01)
*B05D 1/38* (2006.01)
*C01B 31/02* (2006.01)

(52) U.S. Cl. ........ 427/214; 427/240; 427/284; 977/742; 977/753

(58) Field of Classification Search .......... 977/734–753, 977/762–787; 423/445 R–445 B; 427/180, 427/202, 203, 214, 215, 258, 372.2, 384–387, 427/402, 407.1
See application file for complete search history.

(56) References Cited

U.S. PATENT DOCUMENTS

| | | | |
|---|---|---|---|
| 6,924,335 B2 | 8/2005 | Fan et al. | |
| 7,037,562 B2 | 5/2006 | Jimenez | |
| 7,160,620 B2 | 1/2007 | Huang et al. | |
| 7,183,003 B2 | 2/2007 | Leu et al. | |
| 7,235,442 B2 | 6/2007 | Wang et al. | |
| 7,291,396 B2 | 11/2007 | Huang et al. | |
| 7,393,428 B2 | 7/2008 | Huang et al. | |
| 7,396,477 B2 | 7/2008 | Hsiao | |
| 7,438,844 B2 | 10/2008 | Huang et al. | |
| 7,491,628 B2 | 2/2009 | Noca et al. | |
| 7,534,648 B2* | 5/2009 | Raravikar et al. | 438/99 |
| 7,569,425 B2 | 8/2009 | Huang et al. | |
| 7,611,628 B1* | 11/2009 | Hinds, III | 210/500.27 |
| 7,611,651 B2 | 11/2009 | Huang et al. | |
| 7,695,769 B2* | 4/2010 | Watanabe et al. | 427/372.2 |
| 2005/0073332 A1 | 4/2005 | Sato | |
| 2005/0127351 A1 | 6/2005 | Tolt | |
| 2005/0136248 A1 | 6/2005 | Leu et al. | |
| 2005/0167647 A1 | 8/2005 | Huang et al. | |
| 2005/0170169 A1* | 8/2005 | Watanabe et al. | 428/323 |
| 2005/0230082 A1 | 10/2005 | Chen | |
| 2005/0245659 A1 | 11/2005 | Chen | |
| 2006/0073712 A1 | 4/2006 | Suhir | |
| 2006/0093642 A1 | 5/2006 | Ranade | |
| 2006/0118791 A1 | 6/2006 | Leu et al. | |
| 2006/0231970 A1 | 10/2006 | Huang et al. | |
| 2007/0004081 A1 | 1/2007 | Hsiao | |
| 2007/0059864 A1 | 3/2007 | Huang et al. | |
| 2007/0099311 A1 | 5/2007 | Zhou et al. | |
| 2007/0207182 A1 | 9/2007 | Weber et al. | |
| 2008/0081176 A1 | 4/2008 | Huang et al. | |
| 2009/0032496 A1 | 2/2009 | Yao et al. | |
| 2009/0130370 A1* | 5/2009 | Sansom et al. | 428/87 |

FOREIGN PATENT DOCUMENTS

| | | |
|---|---|---|
| JP | 2006 114265 | 4/2006 |
| JP | 2006 164835 | 6/2006 |
| TW | 253 898 | 4/2006 |
| TW | 256 877 | 6/2006 |
| WO | WO 2006/041535 | 4/2006 |

OTHER PUBLICATIONS

Haggenmueller et al., "Aligned single-walled carbon nanotubes in composites by melt processing methods," Chemical Physics Letters 330 (2000) 219-225.*
Lahiff et al., "Selective Positioning and Density Control of Nanotubes within a Polymer Thin Film," Nano Lett., vol. 3, No. 10, 2003, 1333-1337.*
Lahiff, E., et al., "Selective positioning and density control of nanotubes within a polymer thin film," Nano letters 3(10): 1333-1337, 2003.
Nerushev, O.A., et al., "The temperature dependence of Fe-catalysed growth of carbon nanotubes on silicon substrates," Physica. B, Condensed matter 323(1-4): 51-59, 2002.
Barber, A. H., et al., "Static and dynamic wetting measurements of single carbon nanotubes," Physical review letters 92(18): 186103, 2004.
Correa-Duarte, M.A., et al., "Nanoengineered polymeric thin films by sintering CNT-coated polystyrene spheres," Small 2 (2): 220-224, 2006.
Firowska, I.O., et al., "Highly ordered MWNT-based matrixes: topography at the nanoscale conceived for tissue engineering," Langmuir 22(12): 5427-5434, 2006.

(Continued)

*Primary Examiner* — William Phillip Fletcher, III
(74) *Attorney, Agent, or Firm* — Tope-McKay & Associates; Cary Tope-McKay

(57) ABSTRACT

A method is provided for creating composites by combining pre-fabricated nanoscale structures (nanostructures) and other materials in which the nanostructures are anchored. This method results in anchored nanostructures with their base held and encased within the anchoring material to a specified depth and with a specified length of protrusion of the nanostructures from the anchoring material. This represents a major advance over previous methods of creating composites containing nanostructures which were limited to fully embedded nanostructures or, at best, very limited and uncontrolled protrusion of nanostructures. In summary, the current method involves bringing nanostructures and anchoring materials into physical contact in a controlled fashion and optionally conducting a treatment step to complete the anchoring process.

13 Claims, 11 Drawing Sheets

OTHER PUBLICATIONS

Jung, Y.J., et al., "Aligned carbon nanotube-polymer hybrid architectures for diverse flexible electronic applications," Nano letters 6(3): 413-418, 2006.
Mamedov, A. A., et al., "Molecular design of strong single-wall carbon nanotube/polyelectrolyte multilayer composites," Nature materials 1(3): 190-194, 2005.
Melechko, A. V., et al., "Vertically aligned carbon nanofibers and related structures: Controlled synthesis and directed assembly," Journal of applied physics 97(4): 041301, 2005.
Morjan, R.E., et al., "High growth rates and wall decoration of carbon nanotubes grown by plasma-enhanced chemical vapour deposition," Chemical physics letters 383 (3-4): 385-390, 2004.
Ren, Z.F., et al., "Synthesis of large arrays of well-aligned carbon nanotubes on glass," Science 282(5391): 1105-1107, 1998.
Xie, X.L., et al., "Dispersion and alignment of carbon nanotubes in polymer matrix: A review," materials science & engineering. R, Reports 49(4): 89-112, 2005.
Ajayan, P.M., et al., "Aligned carbon nanotube arrays formed by cutting a polymer resin-nanotube composite," Science 265(5176): 1212-1214, 1994.
Boo, H., et al., "Electrochemical nanoneedle biosensor based on multiwall carbon nanotube," Analytical chemistry 78(2): 617-620, 2006.
Huber, C.A., et al., "Nanowire array composites," Science 263(5148): 800-802, 1994.
Jin, L., et al., "Alignment of carbon nanotubes in a polymer matrix by mechanical stretching," Applied physics letters 73(9): 1197-1199, 1998.
Li, W. Z., et al., "Large-scale synthesis of aligned carbon nanotubes," Science 274(5293): 1701-1703, 1996.
Ravikar, N. R., et al., "Embedded carbon-nanotube-stiffened polymer surfaces," Small 1(3): 317-320, 2005.
Suh, J.S., and Lee, J.S., "Highly ordered two-dimensional carbon nanotube arrays," Applied physics letters 75(14): 2047-2049, 1999.
Wagner, H.D., et al., "Stress-induced fragmentation of multiwall carbon nanotubes in a polymer matrix," Applied physics letters 72(2): 188-190, 1998.
Wong, E.W., et al., "Nanobeam mechanics: Elasticity, strength, and toughness of nanorods and nanotubes," Science 277(5334): 1971-1975, 1997.
Zhao, L.L., et al., "Porous silicon and alumina as chemically reactive templates for the synthesis of tubes and wires of SnSe, Sn, and $SnO2$," Angewandte Chemie 45(2): 311-315, 2006.
Huang, X., et al., "Inherent-opening-controlled pattern formation in carbon nanotube arrays," Nanotechnology 18 (2007) 305301 (6pp).
Sansom, E.B., "Experimental Investigation on Patterning of Anchored and Unanchored Aligned Carbon Nanotube Mats by Fluid Immersion and Evaporation," Ph. D. Thesis, California Institute of Technology, Pasadena, California, 2007.
International Preliminay Report on Patentability for PCT/US2008/012641.
PCT International Search Report and the Written Opinion of the International Searching Authority for PCT/US2007/015754.
Young Joon Jung, et al., "Aligned carbon Nanotube-Polymer Hybrid Architectures for diverse Flexible Electronic Applications," Nano Letters, ACS, Washington. DC, US, vol. 6, No. 3, Mar. 31, 2006, pp. 413-418.
E. Lahiff, et al., "Selective positioning and density control of nanotubes within a polymer," Nano Letters, vol. 3, No. 10, Sep. 13, 2003, pp. 1333-1337.
N.R. Rarravikar, et al., "Embedded carbon-nanotube stiffened polymer surfaces," Small, vol. 1, No. 3, 2005, pp. 317-320.
PCT International Preliminary Report on Patentability for PCT/US2007/015754.
Sinha, N., et al, "Carbon Nanotubes for Biomedical Application," IEEE Transactions on Nanobioscience, IEEE Service Center, Piscataway, NY, vol. 4, No. 2, Jun. 1, 2005, pp. 180-195.
Liming Dai, et al., "Functionalized surfaces based on polymers and carbon nanotubes for some biomedical and optoelectronic applications," Nanotechnology, vol. 14, No. 10, Oct. 1, 2003, pp. 1084-1097.
PCT International Search Report and the Written Opinion of the International Searching Authority for PCT/US2010/000243.
Borca-Tasciuc, T., Mazumder, M., Son, Y., Pal, S. K., Schadler, L. S. and Ajayan, P. M., 2007, "Anisotropic thermal diffusivity characterization of aligned carbon nanotube-polymer composites," Journal of Nanoscience and Nanotechnology 7(4): 1581-1588.
Choi, T., Poulikakos, D., Tharian, J. and Sennhauser, U., 2005, "Measurement of thermal conductivity of individual multiwalled carbon nanotubes by the 3-omega method," Applied physics letters 87(1): 013108.
Crabtree, G. W. and Lewis, N. S., 2007, "Solar energy conversion," Physics today 60(3): 37-42.
Falvo, M. R., Clary, G. J., Taylor, R. M., Chi, V., Brooks, F. P., Washburn, S. and Superfine, R., 1997, "Bending and buckling of carbon nanotubes under large strain," Nature 389(6651): 582-584.
Fan, S. S., Chapline, M. G., Franklin, N. R., Tombler, T. W., Cassell, A. M. and Dai, H. J., 1999, "Self-oriented regular arrays of carbon nanotubes and their field emission properties," Science 283(5401): 512-4.
Frank, S., Poncharal, P., Wang, Z. L. and de Heer, W. A., 1998, "Carbon nanotube quantum resistors," Science 280(5370): 1744-1746.
Hinds, B. J., Chopra, N., Rantell, T., Andrews, R., Gavalas, V. and Bachas, L. G., 2004, "Aligned multiwalled carbon nanotube membranes," Science 303(5654): 62-5.
Huang, H., Liu, C. H., Wu, Y. and Fan, S. S., 2005, "Aligned carbon nanotube composite films for thermal management," Advanced materials 17(13): 1652.
Iijima, S., 1991, "Helical microtubules of graphitic carbon," Nature 354(6348): 56-58.
Kam, N. W. S., O'Connell, M., Wisdom, J. A. and Dal. H. J., 2005, "Carbon nanotubes as multifunctional biological transporters and near-infrared agents for selective cancer cell destruction," Proceedings of the National Academy of Sciences of the United States of America 102(33): 11600-11605.
Kim, P., Shi, L., Majumdar, A. and McEuen, P. L., 2001, "Thermal transport measurements of individual multiwalled nanotubes," Physical review letters 87(21): 215502.
Lee, J. U., 2005, "Photovoltaic effect in ideal carbon nanotube diodes," Applied physics letters 87(7): 073101.
Noca, F., Bronikowski, M., Sansom, E. B., Zhou, J. and Gharib, M., 2007, "Nanowicks," NASA Tech Briefs 31(10): 32-3.
Raravikar, N. R., Schadler, L. S., Vijayaraghavan, A. S., Zhao, Y. P., Wei, B. Q. and Ajayan, P. M., 2005, "Synthesis and characterization of thickness-aligned carbon nanotube-polymer composite films," Chemistry of materials 17(5): 974-983.
Tian, B. Z., Zheng, X. L., Kempa, T. J., Fang, Y., Yu, N. F., Yu, G. H., Huang, J. L. and Lieber, C. M., 2007, "Coaxial silicon nanowires as solar cells and nanoelectronic power sources," Nature 449(7164): 885-8.
Xu, Z., Bai, X. D., Wang, Z. L. and Wang, E. G., 2006, "Multiwall carbon nanotubes made of monochirality graphite shells," Journal of the American Chemical Society 128(4): 1052-1053.
Yurdumakan, B., Raravikar, N. R., Ajayan, P. M. and Dhinojwala, A., 2005, "Synthetic gecko foot-hairs from multiwalled carbon nanotubes," Chemical Communications 30: 3799-3801.
Zhou, J., Noca, F. and Gharib, M., 2006, "Flow conveying and diagnosis with carbon nanotube arrays," Nanotechnology 17(19): 4845-4853.
Creel, C.J., M.A. Lovich, and E.R. Edelman, Arterial paclitaxel distribution and deposition. Circulation Research, 2000. 86(8): p. 879-884.
Scheller, B., U. Speck, C. Abramjuk, U. Bernhardt, M. Bohm, and G. Nickenig, Paclitaxel balloon coating, a novel method for prevention and therapy of restenosis. Circulation, 2004. 110(7): p. 810-814.
Bronikowski, M.J., Longer nanotubes at lower temperatures: The influence of effective activation energies on carbon nanotube growth by thermal chemical vapor deposition. Journal of Physical Chemistry C, 2007. 111(48): p. 17705-17712.
International Preliminary Report on Patentability for PCT/US08/012641.

* cited by examiner

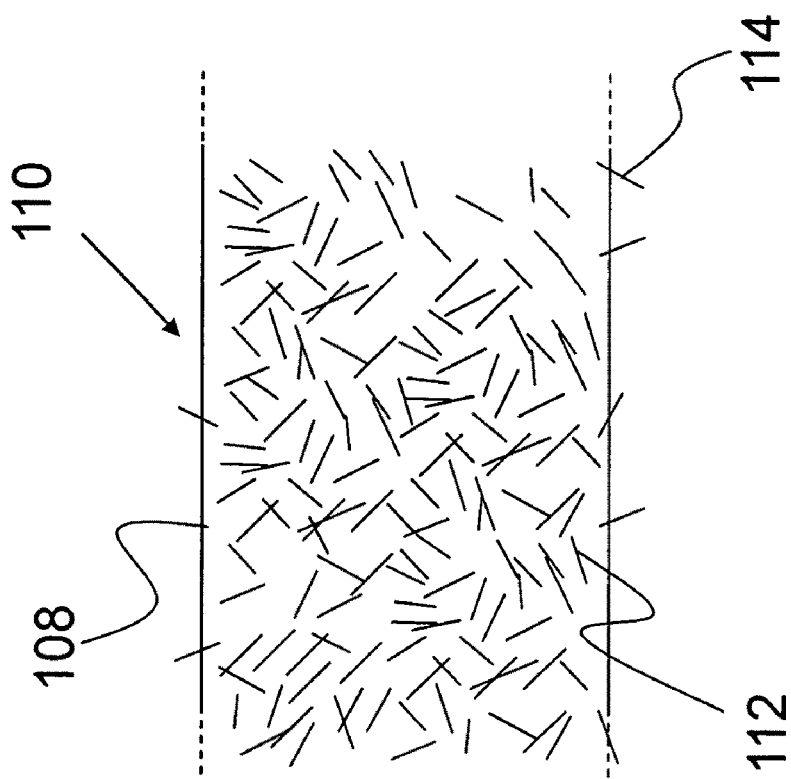
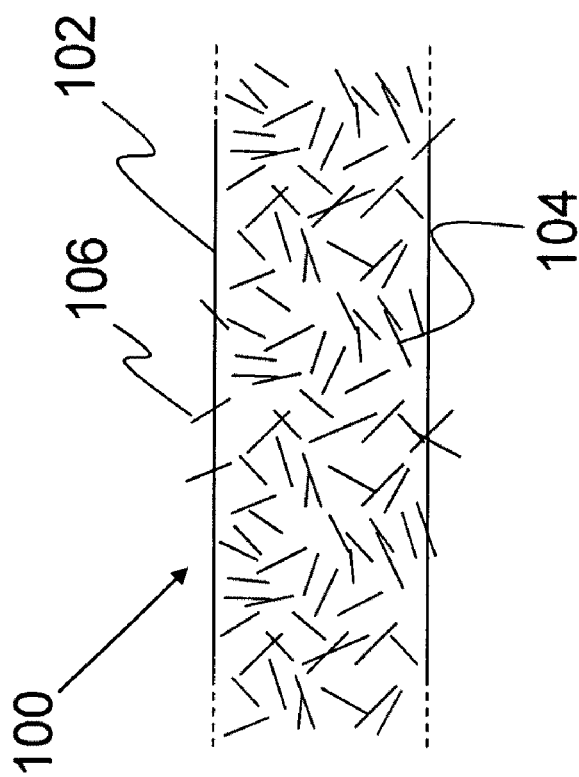
FIG. 1A
FIG. 1B

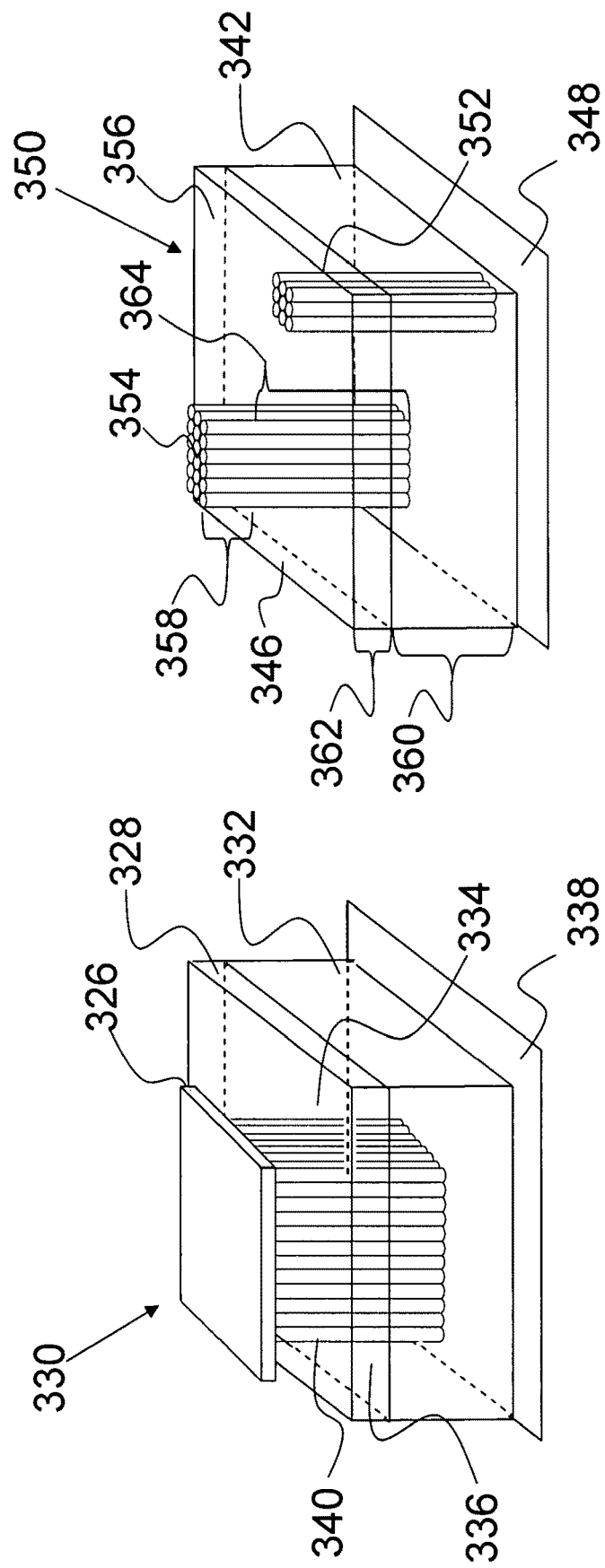

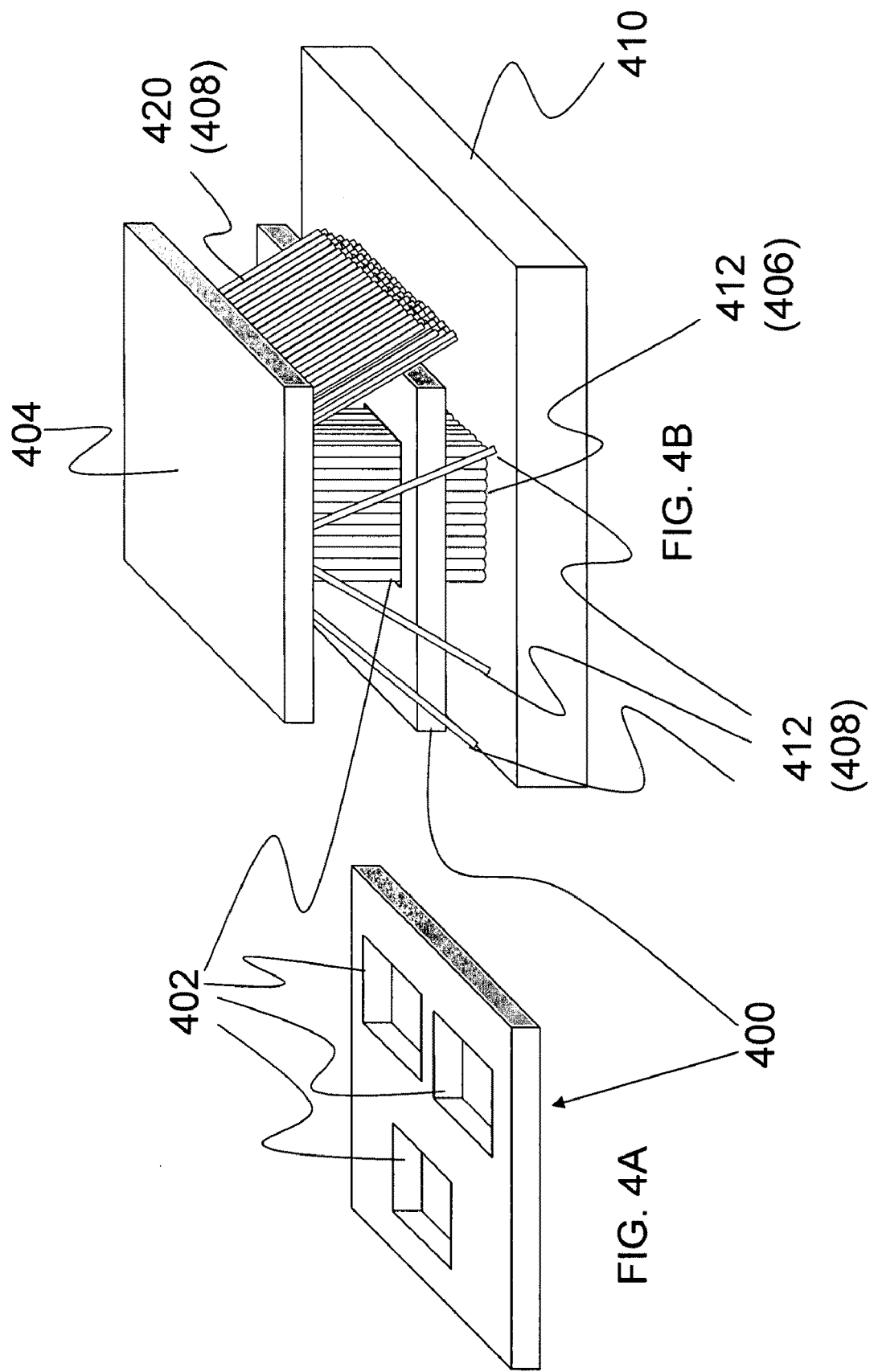

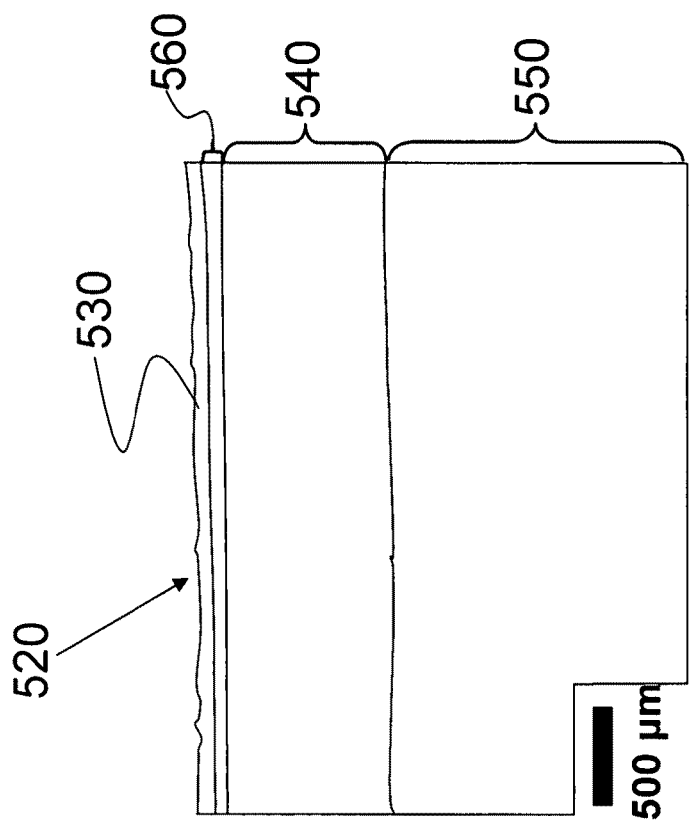
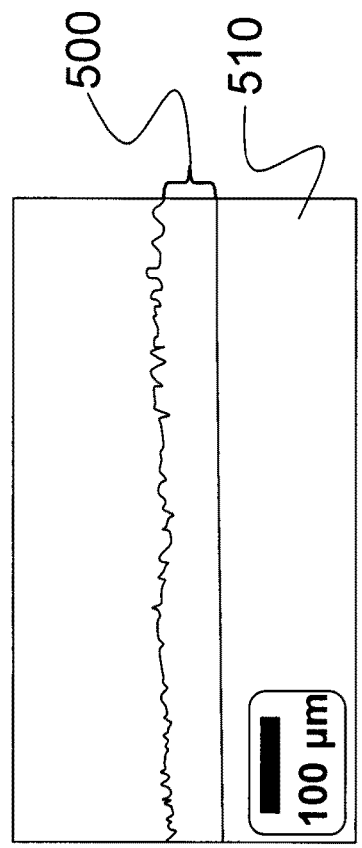
FIG. 5B
FIG. 5A

METHOD FOR SELECTIVELY ANCHORING LARGE NUMBERS OF NANOSCALE STRUCTURES

PRIORITY CLAIM

The present application is a non-provisional patent application, claiming the benefit of priority of U.S. Provisional Patent Application No. 60/819,872, filed Jul. 10, 2006, titled, "Method for Anchoring Large Numbers of Nanoscale Structures."

BACKGROUND OF THE INVENTION (1) Technical Field

The present invention is generally directed to the processing of formed nanoscale objects and, more particularly, to anchoring of nanoscale objects within a material.

(2) Description of Related Art (2.1) Nanostructure Properties and Applications

Nanostructures are widely expected to bring about major technological advances. For more than a decade, nanostructures have been the subject of intense study, both in characterization and fabrication. Nanotubes are an integral component in devices requiring reduced power consumption, reduced mass and extreme functional gains through economies of scale. Unlike larger scale materials and devices of the same composition, the size-dependent properties of nanoscale devices greatly benefit from their small length scales.

Nanoscale devices are currently only intended for applications in highly controlled environments. This general lack of robustness in "everyday" environments is a key factor inhibiting the realization of useful nanoscale-based devices. Potentially damaging environmental considerations which bar the use of nanostructures in an environment include the presence of: airborne particles, fluids, impacts and interactions with solid surfaces and potential interaction with factors such as undesirable temperatures, fluid flows, and chemical reactions. Typical solutions to these environmental hazards involve performing experiments, conducting additional device development, and performing fabrication under highly controlled conditions (usually within a "clean room"). As a result, nanoscale devices are typically restricted to applications in which the devices are in an environment where potentially damaging environmental interactions can be controlled.

A wide variety of useful applications for nanostructures exist. However a viable solution which mitigates the environmental hazards posed to nano-based technologies typically prohibits them from being used in these applications. A small sample of these applications include flat panel displays based on field emission and hydrodynamic drag reducing nano- and micro-structured skins and surfaces.

(2.2) Nanostructure Composites

One solution has been to fully immerse the nanostructures within curable materials thereby forming a composite. Such composites augment mechanical properties such as the elastic modulus and toughness of the nanostructure. In general, this is accomplished by distributing impact forces across the large surface area of the curable material, transferring the force through the composite instead of directly through the nanostructure, and out the bottom surface area of the composite.

Recent developments, specifically in the field of post-fabrication production, have focused on addressing design considerations for fields which have had long felt needs. Most post-fabrication production has worked to develop solutions to the problem of overcoming existing environmental conditions which have historically been unfavorable to nanostructures. One recent development has focused on immersing nanostructures within curable materials in order to form a nanostructure composite. Composites often consist of a combination of polymeric materials and carbon nanotubes, but the techniques for producing them characteristically lack control of nanotube placement.

One such post-fabrication handling technique uses fixed nanostructures within a deposit of silicon oxide pads via a lithographic shadowmask process onto SiC nanorods and multi-walled carbon nanotubes dispersed on an atomically flat $MoS_2$ surface, leaving some of the nanostructures protruding from the edges of the pads Wong et al. 1997.

A second method involves dispersing arc-discharge-grown carbon nanotubes within a temperature-cured epoxy resin, curing, and then thinly slicing the composite with a microtome, leaving the nanotubes well-aligned and either fully embedded or tangent to and flush with the slice surfaces Ajayan et al. 1994.

A third method involves using a blade to smear a UV-curable epoxy over carbon nanotubes deposited onto a surface from a solution, followed by UV curing and mechanical testing Wagner et al. 1998.

A fourth method involves the dispersion of ground arc-discharge grown carbon nanotubes in a thermoplastic polymer, time curing a layer sitting on a Teflon surface, and peeling off the nanotube-polymer composite for mechanical tests Jin et al. 1998.

A fifth method uses a chemical vapor deposition growth of aligned arrays of carbon nanotubes followed by submersion of the entire sample and growth substrate within a curable polymer (PMMA or PDMS) solution, followed by curing and removing of the nanotube-polymer composite Raravikar et al. 2005.

A sixth method involves Van der Waals-based attachment of a single carbon nanotube to an etched tungsten tip followed by covering the tungsten tip and the base of the carbon nanotube with a UV-curable polymer using native spreading of the polymer on the tip, then UV curing, leaving the tip "insulated" relative to the surroundings while the nanotube is exposed to the local environment Boo et al. 2006.

The aforementioned methods for mechanically protecting the nanostructures suffer from unpredictable dispersal of the nanotubes within the materials. In FIG. 1A a top view of a composite material 100 is shown. The composite material 100 comprises a plurality of nanostructures 104 within a cured material 102. To form the composite material 102, the nanostructures 104 are placed on a layer of fluid material. Spin-coating the material prior to curing results in a largely level surface. The nanostructures 104 become randomly dispersed within the fluid material as a result of the spin-coating process. Although many nanostructures 104 are fully immersed in the cured material 102, many nanostructures 106 randomly protrude from the material 102.

In FIG. 1B a side view of the composite material 110 is shown. Nanostructures 112 embedded within the cured layer 108 are dispersed randomly. On occasion nanostructures 114 randomly protrude from the cured layer 108. For nanostructures 112 within the cured layer 108, the cured layer 108 offers mechanical protection from impact events. However, for applications which utilize properties in addition to mechanical properties of the nanostructures 112, the nanostructures 114 protruding from surfaces do not protrude with enough regularity and specificity to take advantage of these properties. As such, there is a need for the ability to controllably disperse the nanostructures 112 within a cured layer 108 (polymer) to achieving sufficient wetting, adhesion, and mechanical load transfer between the cured layer and the nanostructures Xie et al. 2005. There is a further need for the ability to control the depth of a nanostructure 112 within the cured layer 108.

Nanostructure composite 110, manufacturing techniques as they exist in the art, further lack the ability to control the orientation and depth of the nanostructure 112 within the cured layer 108. Therefore, applications requiring anchored partially-immersed nanostructures 114 within a cured layer, such as growth templates for cell and tissue cultures, are unable to take advantage of enhanced characteristics offered by the available nanostructure composites 110.

Other works have dealt with related topics. None have shown controllable anchoring of wholly immersed nanostructures 112 or partially immersed nanostructures 114 having free ends in exact configurations. For example, in the work of Lahiff et al. 2003, the authors describe that "a thin-film of polydimethylsiloxane (PDMS) was spin coated onto the nanotube film." Surprisingly the authors further disclose "... which indicates that it is possible only the very tips of the tubes that project from the PDMS surface." The projection of the exposed nanotube tips from the surface has not proven controllable. In general, the act of spin coating is an imprecise method with no mechanism for controllably immersing a nanostructure within a fluid, such as PDMS.

In other work, Jung et al. 2006, the authors consider the field emission results from their samples, prepared as in Lahiff et al. 2003. The authors state "Scanning Electron Microscope images (not shown) of our functional devices show that the very few tips that are exposed above the PDMS surface are 2-3 μm long and are separated by distances of similar or larger lengths." Using their approach, the few tips exposed from the surface of the PDMS could not be shown to be controllable. The authors further failed to provide any quantification of how many tips are exposed, or a guarantee of reproducibility, or an ability to adjust the degree of protrusion above the surface.

The above methods unintentionally and uncontrollably result in carbon nanotubes (or, more generally, nanostructures) protruding from the upper surface of their PDMS. As such no repeatable means of control over this parameter is offered by applying the curable polymer on top of the nanostructures, curing and then removing the resulting composite. Even when combining a spin-coating procedure with the above procedure, no control over the resulting length of the protrusion of the nanostructures from the surface of the PDMS is disclosed. Further, residual polymer is likely to cover all portions of the surface since PDMS has been shown to be highly wetting on carbon nanotubes Barber et al. 2004 (PDMS also easily wets many other materials).

Additionally, spin-coating of a material using a highly viscous fluid such as curable PDMS, on top of nanostructures will significantly alter the nanostructures' local relative configuration. This unavoidable drawback would prevent the formation of specific (pre-determined), small-scale patterns of nanostructures within the cured material.

The above methods fail to provide for control of the overall pattern of nanostructures embedded within the cured layer. A need also exists for controlling the depth and overall height of a nanostructure protruding from a surface. A further need exists for preserving a preexisting pattern of nanostructures within, and optionally protruding from, the cured layer. A still further need exists for a method that provides a mass produced composite formed with repeating patterns of nanostructures. A still further need exists for a method that provides the ability to selectively embed specific nanostructures from a group of nanostructures into a composite.

SUMMARY OF THE INVENTION

The present invention overcomes the aforementioned shortcomings in the prior art. The present invention is a method for fastening a plurality of nanoscale structures within a media to form a nanostructure composite. The acts include surrounding a plurality of nanostructures, each having a defined height and orientation, with a fluid layer, the fluid layer having a substantially uniform thickness which is less than or equal to the height of the plurality of nanostructures. The fluid layer is then altered to form an anchoring layer which secures the nanostructures within the anchoring layer. As a result a composite of nanostructures where the nanostructures is produced, have been partially embedded into the anchoring layer at a user desired depth.

In another aspect, the nanostructures may be carbon nanotubes, nanowires, and nanoparticles.

In another aspect the act of arranging the plurality of nanoscale structures arranges the structures in a specific pre-defined pattern.

In yet another aspect the fluid layer is spin-coated to provide a fluid layer of substantially uniform thickness.

In yet another aspect, individual nanostructures comprising the plurality of nanostructures are comprised of different materials.

In a further aspect, a second fluid layer of specified thickness is applied to the anchoring layer. The specified thickness of the second fluid layer being less than the height of the plurality of nanostructures.

In a still further aspect, the second fluid layer is altered to form a second anchoring layer. The nanostructures are thereby secured in the second anchoring layer.

In a still further aspect, the second fluid layer is comprised of a material which is different from the material used to form the first fluid layer or the first anchoring layer.

In another aspect of the present invention, a plurality of nanostructures supported on a first surface are used to form a multilayer nanostructure composite. The nanostructures are surrounded by a first fluid layer, the fluid layer having a specified thickness, the specified thickness of the first fluid layer being less than or equal to the height of the first plurality of nanostructures. The first fluid layer is then altered (or cured) to form a first anchoring layer, thereby fastening the first plurality of nanostructures within the first anchoring layer. A second fluid layer is applied beneath, and in contact with, the first anchoring layer. A second plurality of nanostructures supported on a second surface is then surrounded with a second fluid layer. After the second fluid layer is altered, the second fluid layer becomes the second anchoring layer, which fastens the nanostructure within the second anchoring layer.

In another aspect the first surface is removed from the first plurality of nanostructures. A third plurality of nanostructures, supported on a third surface, is surrounded by a third fluid layer placed on top of the first anchoring layer. The third plurality of nanostructures is surrounded by a third fluid layer having a specified thickness. The specified thickness of the third fluid layer is less than or equal to the height of the third plurality of nanostructures. The third fluid layer is altered to form a third anchoring layer.

In another aspect, the support surface from the plurality of nanostructures is removed.

In another aspect of the present invention, a mask is used to generate a nanostructure composite with either defined or repeatable nanostructure patterns anchored within a fluid layer. A plurality of nanostructures, each having a length and residing on a support, are superimposed upon each other. The mask has a bottom surface, a depth less than the length of the plurality of nanostructures, and at least one channel such that the plurality of nanostructures supported on the surface may selectively pass through the mask. The nanostructures which pass through the channels form a masked nanostructure pattern. The masked nanostructure pattern is surrounded with a fluid layer. The fluid layer is then altered to form a first anchoring layer which fastens the masked nanostructure pattern within the first anchoring layer.

In another aspect, the support surface of the plurality of nanostructures is removed. A second plurality of nanostructures supported on a second surface is surrounded by a second fluid layer which covers the first anchoring layer. The second plurality of nanostructures has a defined height and orientation within the second fluid layer. The second fluid layer has a specified thickness, the specified thickness of the second fluid layer being less than or equal to the height of the second plurality of nanostructures. The second fluid layer is then altered to form a second anchoring layer, thereby fastening the second plurality of nanostructures within the second anchoring layer.

In another aspect, the second fluid layer is applied between the anchoring layer and the surface, the specified thickness of the second fluid layer being less than the height of the plurality of nanostructures.

In another aspect the support surface is removed from the plurality of nanostructures.

In a still further aspect the fluid layer is spin-coated.

In another aspect, the plurality of nanostructures is selected from a group consisting of carbon nanotubes, nanotubes, nanowires, and nanoparticles.

In yet another aspect a second fluid layer of specified thickness is applied between the anchoring layer and the surface, the specified thickness of the second fluid layer being less than the height of the plurality of nanostructures.

In another aspect, the present invention is a nanostructure composite formed of a plurality of nanostructures controllably immersed within an anchoring layer.

In another aspect the nanostructures reside at a substantially uniform depth within the anchoring material In yet another aspect the nanostructures are configured in a defined pattern that is retained upon insertion into the anchoring material In a still further aspect, the nanostructures possess a pre-fabricated repeating pattern that is retained upon insertion into the anchoring material.

In yet another aspect, the nanostructures are carbon nanotubes.

In another aspect the anchoring material is selected for specific physical properties including but not limited to temperature resistance, mechanical protection, and UV protection.

BRIEF DESCRIPTION OF THE DRAWINGS

The objects, features and advantages of the present invention will be apparent from the following detailed descriptions of the disclosed aspects of the invention in conjunction with reference to the following drawings, where:

FIG. 1A is a top view illustration showing a composition consisting of a plurality of nanostructures randomly dispersed;

FIG. 1B is a side view illustration showing a composition consisting of a plurality of nanostructures randomly dispersed;

FIG. 3D is an illustration of a plurality of nanostructures partially immersed within a composite formed of first anchoring layer and second fluid layer;

FIG. 3E is an illustration of two groups of nanostructures, each having a particular configuration, with each group of nanostructures being partially surrounded within a composite formed of first anchoring and second anchoring layer;

FIG. 4A is an illustration of a nanostructure mask for selectively generating a desired nanostructure configuration;

FIG. 4B is an illustration of a plurality of nanostructures supported by a surface and superimposed on a mask for selectively embedding the plurality of nanostructures within the composite;

FIG. 5A is a low magnification image of a 46 µm tall nanocarpet 500 anchored within an anchoring layer;

FIG. 5B is a decreased magnification cross-section view of the carbon nanotube composite;

DETAILED DESCRIPTION

Figure 2:
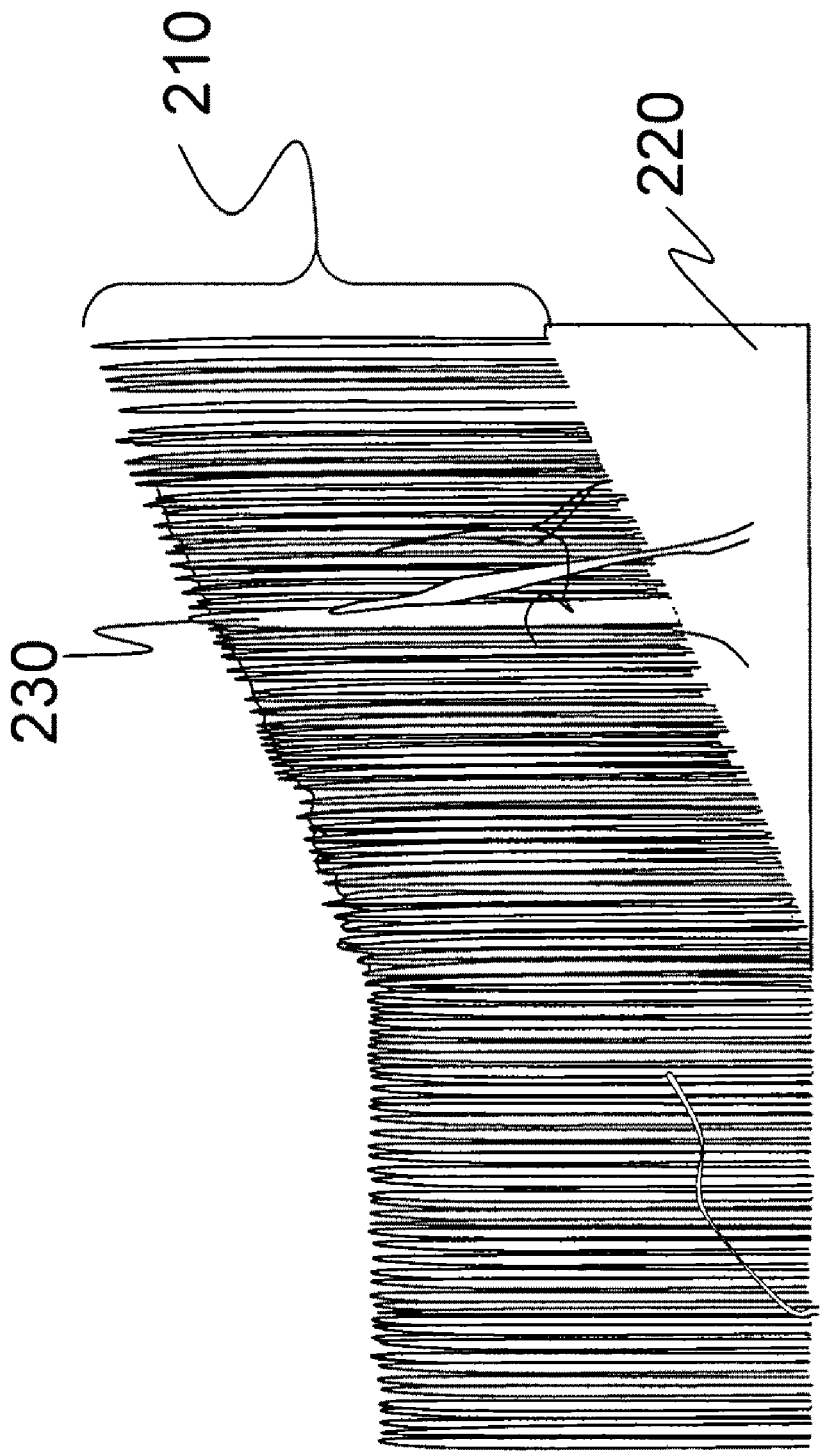
FIG. 2 is scanning electron microscope image of a plurality of prefabricated carbon nanotubes on their original substrate.

The present invention relates to a method for creating nanostructure composites by combining and controlling the placement of pre-fabricated nanoscale structures (nanostructures) and a variety of materials in which the nanostructures are anchored. In one aspect, the present invention teaches a nanostructure composite product comprising a plurality of nanostructures either partially or wholly immersed within an anchoring material. A variety of techniques have been contemplated that allow a plurality of nanostructures to be controllably surrounded and immersed to a specified depth and configuration within an anchoring material.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Below, an introduction to the present invention is provided to give an understanding of the specific aspects. Then, an overview of the principal aspects of the present invention is presented. Finally, a conclusion is provided to briefly summarize the method according to the present invention.

(1) INTRODUCTION

The present invention is intended to increase mechanical strength of, enhance temperature-resistant properties of, and provide a substrate for securing nanostructures for a wide variety of applications. The nanostructures are either partially or wholly embedded within a fluid material. Once the nanostructures are immersed to a desired depth within the fluid layer, the fluid layer is altered such that the nanostructures become anchored within the altered anchoring layer.

The present invention is directed to a product comprising a curable fluid and a plurality of nanostructures controllably anchored within the curable fluid. The present invention is further directed to a method for making the same.

The present invention is intended to fulfill the demand for a wide variety of applications which may have previously benefited from the integration of nanostructures within the devices, but were previously impossible due to the limitations of the nanostructure composites.

The method and apparatus of the present invention may be practiced using a wide variety of materials and configurations as should be appreciated by one of ordinary skill in the art.

A nanostructure may be formed having a variety of lengths, widths, and may also be combined with a number of other nanostructures to form a variety of configurations and patterns. The configurations may either be prefabricated by growing the nanotubes in a particular pattern, or may arise by selectively screening densely packed nanostructures. Suitable types of nanostructures include, but are not limited to nanowires, nanotubes, and nanoparticles. Nanostructures discussed below have been formed using densely-packed aligned arrays of prefabricated nanotubes.

In general, nanostructures may be formed or grown using a variety of materials. Examples of suitable materials include but are not limited to Al, In, Sn, Te, and Se. In general, any element or compound having enhanced properties on the nanoscale may be grouped together to be used to form a plurality of nanostructures. It should be appreciated that the material composition from nanostructure to nanostructure may either be homogenous or heterogeneous within a grouping of nanostructures in order to suit a wide variety of applications.

A wide variety of fluid layers may be used within the spirit of the present invention. Similarly, the fluid layer composition may either be homogeneous or heterogeneous. A homogeneous layer may be comprised of a single component light-cured and/or heat-cured adhesive composed primarily of polyurethane methacrylate resin while a heterogeneous layer may include a polymer plus a cross-linker. An example of such a structure may comprise a heat- or time-cure silicone rubber composed primarily of polydimethylsiloxane and a platinum-containing catalyst involved in the crosslinking reaction.

Suitable fluid layers should have an appropriate viscosity to accomplish the degree of coverage required for the particular application. Often, the first fluid layer is distinguished from the altered anchoring layer by its relatively high viscosity in comparison with the anchoring state. In general, the fluid layer viscosity is selected to ensure an appropriate amount of coverage amongst the individual nanostructures. A less viscous material may be selected for coating nanostructures on the periphery of the nanostructure configuration. A more viscous material may be used to sufficiently infiltrate, and disperse amongst, the nanostructures within the nanostructure configuration. The main characteristic of the anchoring layer is its suitability for anchoring the nanostructures within it.

Environmental conditions also play a roll in selecting an appropriate material for applications requiring resistance to extreme temperatures and broad temperature ranges, exposure to harsh chemicals, immersion in fluids, and exposure to UV rays. The material may also be selected to shield the nanostructures from noise in a wide variety of applications.

In order to alter the state of the fluid layer to that of an anchoring layer, a variety of techniques may be used. These techniques include but are not limited to temperature variation, light curing, and chemical altering of the fluid layer. These techniques may either permanently or reversibly alter the state of the fluid layer to an anchoring layer. An example of a reversible state change may involve a temperature decrease. The decrease in temperature may be used to induce the fluid layer to harden, thereby anchoring the nanostructures within the layer. However upon returning the fluid layer to substantially the original temperature, the anchoring material returns to its original state.

Referring to FIG. 2, a cross-sectional view generated by an electron microscope shows a plurality of nanostructures 210 residing on their fabrication substrate 220. The plurality of nanostructures 210 are densely packed carbon nanotubes 230 that have been grown in a "nanocarpet" type configuration. The nanostructures 210 are shown subsequent to fabrication by self-assembly in a thermal chemical vapor deposition (CVD).

(2) SPECIFIC DETAILS OF THE INVENTION

This invention fulfills the need for a method of anchoring nanostructures which have been formed separately, possibly in specific patterns, into another material, while retaining local configurations of the nanostructures and resulting in free ends of controllable length protruding from the anchoring material. Use of this method allows for transfer of nanostructures from their fabrication substrates either to other substrates or to create free-standing materials, while preserving their basic physical properties and functions.

The present method of producing nanostructure composites makes possible a transfer of nanostructures from one substrate to another. In turn, substrate transfers make possible the use of nanostructures in environments in which they could not be previously used because of the substrates on which they were grown.

Figure 3A:
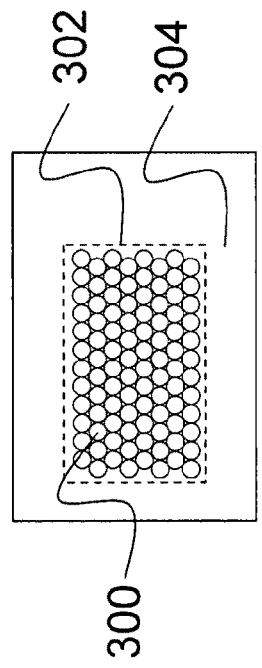
FIG. 3A is a top view of a plurality of nanostructures attached with and supported by a surface.
Figure 3B:
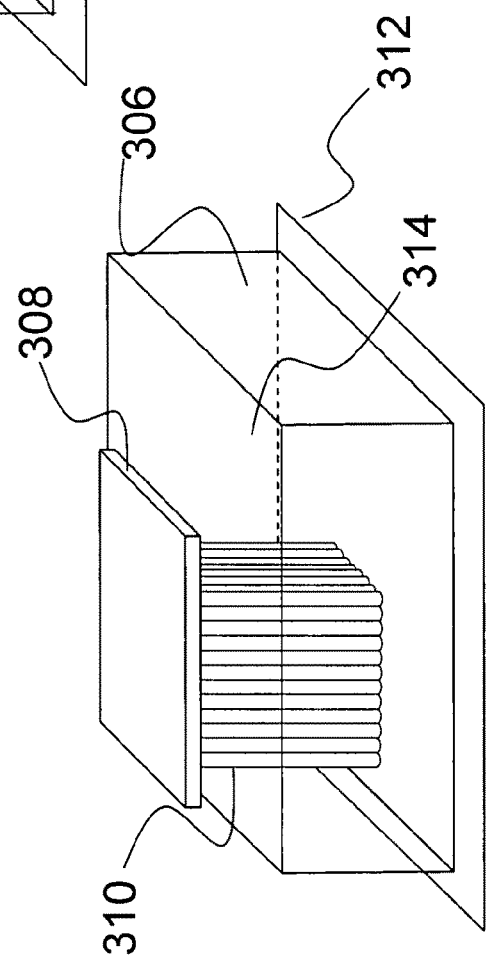
FIG. 3B is an illustration of a plurality of nanostructures attached with a surface at one end of the structure and partially immersed by a fluid layer at the other.

In FIG. 3A a plurality of nanostructures 300 in a rectangular configuration 302 is shown. The pre-fabricated nanostructures 300 are shown residing on the substrate 304 on which they were grown. In FIG. 3B the first act in the current method, not including the fabrication of the nanostructures 310 themselves, is the creation of a fluid layer 306 into which the nanostructures 310 are to be inserted. Once the known-thickness of the material (polymer) comprising the fluid layer 306 has been created, the plurality of nanostructures 310 is inserted into it by using their original substrate 308 for handling purposes. This step is carefully executed, without excessive compaction forces being applied to the substrate 308 in order to prevent damage being inflicted upon the nanostructures 310. Even though the length scales relevant to the nanostructures 310 are very small, the material selected for the fluid layer 306 has sufficient fluidity and appropriate wetting properties to easily fill the spaces between and around the nanostructures 310. This will naturally result in the thickness of the layer of curable polymer 318 (see FIG. 3C) being equal to the depth of insertion of the nanostructures 310. Additionally, controlled positioning of the nanostructures 310 within the fluid layer 306 via their original substrate 308 may be performed in order to insert the nanostructures 310 to some lesser depth than the thickness of the fluid layer 306.

Following the insertion of the nanostructures into the fluid layer 306 of curable material, the fluid layer 306 must generally be cured by some treatment process, though it is possible to use materials which require only the passage of sufficient time in order to cure. Another example of a suitable altering (or curing) method includes heating/cooling. Altering the temperature is one useful mechanism by which the altering of the fluid layer 306 to an anchoring layer 318 may be expedited. The application of specific light treatments, such as applying ultraviolet lighting of sufficient intensity, and the addition of separate chemical agents to act as activators may also be used to alter the fluid layer 306.

Figure 3C:
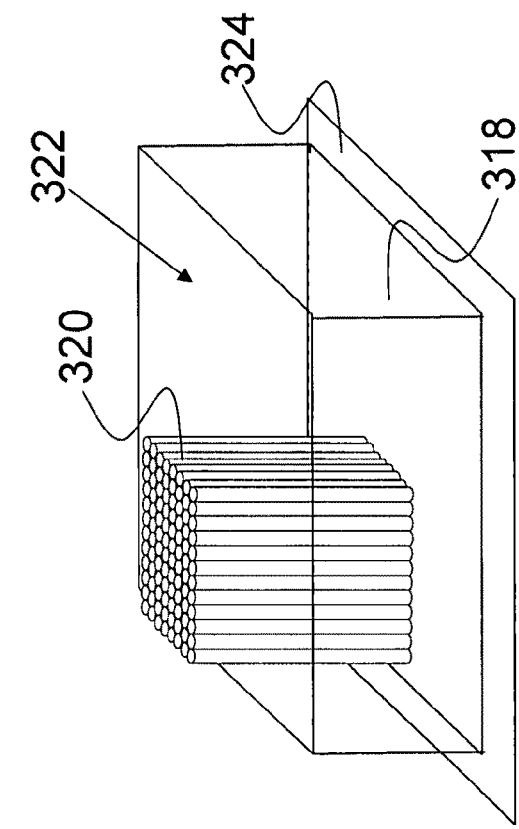
FIG. 3C is an illustration of a plurality of nanostructures partially immersed within a composite.

The entire assembly of the fluid layer 306 on a substrate 312, the process of surrounding the nanostructures 310 attached to the growing substrate 308, is subjected to the curing or altering process to form the anchoring the layer 318 shown in FIG. 3C. Once the altering process has been completed, the nanostructures 320 are anchored in the anchoring layer 318.

In general, nanostructures 300 are not inherently well-attached to their substrates 304 without additional treatments. Following the transformation of the fluid layer 306 into the anchoring layer 318, the nanostructures 320 are firmly anchored, and the original growing substrate 308 of the nanostructures 310 and 320 may now be easily removed. Removing the growing substrate 308 from the nanostructure 310 is carefully carried out depending on the necessity for preservation of the original patterns 302 and local configurations of the nanostructures 300. By lifting off the original growing substrate 308, the nanostructures 320 are left anchored within the anchoring material 318, whereby the depth of their anchoring is controlled by the earlier steps in the method. The "base" of the nanostructures (the ends that were adjacent to their original substrate) now becomes their "top" (the ends that are furthest from the surface of the anchoring material 318). The nanostructures 320 are thus inverted by application of the present method.

Referring back to FIG. 3B, the nanostructures 310 may be surrounded by the fluid layer 306 a number of ways. One such way is to physically immerse the nanostructures 310 into the fluid layer 306 by lowering the nanostructures 310 into the fluid layer 306 in a controlled manner. Another alternative process involves suspending the nanostructures 310 by a support surface 308 over a substrate 312, and pouring the fluid layer 306 onto the substrate 312. The support surface 308 is generally the substrate on which the nanostructures 310 were originally grown. The fluid layer 306 is poured up to a predetermined height such that the nanostructures 310 are partially or wholly immersed in the fluid layer 306. The fluid layer 306 may then be allowed to settle, forming a substantially uniform surface 314. Similarly an unaltered fluid layer 306 may be spread to a specified thickness on the rigid, solid substrate 312 and allowed to settle at a substantially uniform height. An alternative microfabrication process of using highly repeatable centrifugal forces to spread fluid layers 306 to a desired thickness, called spin-coating, is well-known.

Altering the fluid layer 306 and removing the original support surface 308 on which nanostructures 310 may either rest or be attached, as shown in FIG. 3B, yields the nanostructure composite 322 shown in FIG. 3C.

Referring back to FIG. 3C, a plurality of nanostructures 320 are shown anchored within the anchoring layer 318. The properties of the anchoring layer 318 may be modified in order to suit a variety of applications. The nature of the anchoring layer 318 normally depends upon the original material used for the fluid layer 306 (see FIG. 3B) and the method by which the fluid layer 306 is altered. Chemically altering the fluid layer 306 is one such method that may be used to give rise to anchoring layer 318 which exhibits dramatically different properties from those that might have otherwise have been expected given the characteristics of the original fluid layer 306. Although discussed in terms of chemically altering the fluid layer 306, forming the altered anchoring layer 318 may be accomplished a number of ways as will be appreciated by one having ordinary skill in the art.

In FIG. 3D a first anchoring layer 332 residing on a substrate 338 is shown covered by an uncured second fluid layer 328 of either the same or different material having a specified thickness. The thickness of the first anchoring layer 332 and second fluid layer 328 may be modified to suit the environment for which the nanostructure composite 330 is intended. Although shown with the supporting surface 326, the supporting surface 326 may be removed prior to surrounding the nanostructures 340 with the second fluid layer 328. The first anchoring layer 332 may be covered by any number of fluid layers 328. Each fluid layer 328 may be selected to enhance the overall suitability of the nanostructure composite 330 and subsequently altered to fulfill its intended use. With respect to the plurality of layers 328 and 332, the nanostructure composite 330 may be formed of either a homogenous or heterogeneous composition.

In FIG. 3E a nanostructure composite 350 comprising a first nanostructure configuration 352 and second nanostructure configuration 354 at varying depths within a first anchoring layer 342 and second anchoring layer 346 is shown. Although the first nanostructure configuration 352 and second nanostructure configuration 354 are shown as substantially rectangular in shape, a variety of other shapes are also possible. The first nanostructure configuration 352 and second nanostructure configuration 354 are separated by a controlled distance. This distance may be achieved by surrounding a first plurality of nanostructure configurations 302, as shown in FIG. 3A, into a first fluid material, followed by surrounding a separate but similar second nanostructure configuration 302 at the specified distance. Alternatively the first nanostructure configuration 352 and second nanostructure configuration 354 may be selectively grown with a desired distance of separation. In a further alternative the first nanostructure configuration 352 and second nanostructure configuration 354 may be grown from a dense carpet of nanostructures 300 as shown if FIG. 3A. By carefully removing nanostructures residing on the growth substrate 304, the first nanostructure configuration 352 and second nanostructure configuration 354 may be formed.

The depth of insertion, or the depth of anchored nanostructure configuration 352 within a first anchoring layer 342 and second anchoring layer 346 may be controlled in order to establish a desired height of protrusion 358 from the surface 356 of the second anchoring layer 346. Alternatively the length of protrusion 358 may be controlled by increasing or decreasing the height 360 of the first anchoring layer 342 and or the height 362 of the second anchoring layer 346.

The first anchoring layer 342 may be selected such that it will adhere strongly to a second anchoring layer 346 comprised of a different composition. Adhesion between a first anchoring layer 342 and a second anchoring layer 346 may also be accomplished by adding an epoxy or other suitable material subsequent to forming the first anchoring layer 342 but prior to forming the second anchoring layer 346. Alternatively if the first anchoring layer 342 and second anchoring layer 346 are homogeneous, then the nanostructure composite 350 will typically function as though the composite 350 was composed of one single continuous layer rather than being composed of two or more separately created layers 342 and 346. This feature is foreseen to be extremely useful in applications of anchored nanostructures 352 and 354 which require sufficiently thick layers 342 and 346 so as to be mechanically resilient and easy to manipulate, but where thin films of 50 μm, for example, would be much too weak for use. Typically nanostructures on a substrate are considered to have at most one dimension of 100 μm or so, but not typically greater. Therefore layers 342 and 346 of an aggregate thickness equal to the anchoring depth 360 will be quite thin.

In FIG. 4A a mask 400 is shown which has an overall height which is less than the length of the nanostructures. The mask is typically made of a durable material, such as aluminum, that is lithographed to create at least one channel 402 that spans the depth of the mask. The channel 402 selectively permits the passage of a variety of nanostructures such as carbon nanotubes, nanotubes, nanowires, and/or nanoparticles. The dimensions of the mask 402 allow specific nanotube patterns to be generated. The mask 402 is typically made from a material which can be reused. In general, large carpets of nanotubes can be placed on top of the mask 402 to form specific masked nanotube patterns. These may then be partially submerged into a fluid anchoring layer to mass produce nanostructure composites. A further advantage of using the mask 402 is the ability to transport the composite nanostructure with the mask and original growing substrate attached. This serves to fully protect the nanostructures in commercial applications, during handling, as well as shipping.

In FIG. 4B a surface 404 having a plurality of nanostructures 412 perpendicularly orientated to the surface 404 is shown. Since the nanostructures 412 have a length that exceeds the depth of the mask 400, superimposing the surface 404 onto the mask 400 allows the plurality of nanostructures 412 associated with the surface 404 to selectively pass through the channels 402 of the mask 400. Although some of the nanostructures 406 are able to pass through the channels 402, others 408 are deflected. The nanostructures that cannot pass through the channels 402 of the mask 400 (the deflected nanostructures 408) are deflected in various directions. The nanotubes that are allowed to pass through each channel 402 allow an array of conducted (permit the passages of) nanostructures 406 to form a masked nanotube pattern.

Next, the conducted nanostructures 406 are submerged in a fluid layer 410 at a depth, typically equal to the depth of the mask 400. The mask 400 generally prevents the deflected nanostructures 408 from entering the fluid layer 410. By curing or altering the fluid layer 410, a first anchoring layer is formed which securely fastens the conducted nanostructures 406 to the first anchoring layer. The surface 404 may then be removed, resulting in initial composite containing nanostructures having nanostructures arranged in a masked nanotube pattern which mirrors the channel dimensions and placement. At this point, a second fluid layer of the same or a different material can be applied to the first layer and then cured such that the composite heights are less than the total length of the nanostructures.

Upon generation of the nanostructure composite formed with the masked pattern, a second surface containing a second plurality of nanostructures may be immersed into a second fluid layer that is flowed over the previously created anchoring layer. Upon curing the second fluid layer, the second surface can be removed resulting in a composite containing nanostructures from multiple surfaces. Though not explicitly stated above, it is possible that a second mask may be used at this stage to create an additional nanostructure pattern. It is important to note that the height of the second fluid layer should be less than the height of the exposed portions of the nanostructures from the first surface. It should be noted that the method of spin-coating the fluid layers is one example of a method to apply the fluid layers evenly before they are cured.

(3) NANOSTRUCTURE COMPOSITES USING CARBON NANOTUBES

Although nanostructure composites may be formed using a variety of nanostructures and anchoring materials, the following discussion provides a detailed description of the formation of one such composite, specifically a Carbon Nanotube Composite (CNT).

The CNT arrays used to demonstrate the present anchoring method were grown by the well-known process of thermal Chemical Vapor Deposition on iron sputtered quartz surfaces. This growth process results in densely packed arrays of multi-walled carbon nanotubes wherever catalyst material is present. The CNT arrays are typically oriented perpendicular to the growth surface. The overall height of the array on a given sample is typically quite uniform. Overall alignment is substantially uniform at larger length scales, while entanglement is typically present at the nanoscale. The typical carbon nanotube diameter is roughly 20 nm while inter-nanotube spacing is between 50-100 nm.

Depending on the existing growth parameters such as growth time, feedgas flowrate (and therefore average flow velocity at the sample surface) and composition, system pressure, and thickness of the pre-deposited catalyst layer, array heights can be obtained on the order of 10 nm for short duration growth times but may reach over 150 nm for growth times of longer duration. In general the properties of alignment and array height uniformity tend to be more uniform for taller arrays.

Three acts of the present method include spin-coating a layer of uncured material to produce the desired thickness of a fluid layer, vertical insertion of the CNTs (or any other suitable nanostructure) into the fluid layer, and curing the entire assembly. The above-referenced steps may be executed any number of times in order to generate multi-layered composites, or composites having particular CNT array configurations. Optional steps such as the removal of the original growth substrate of the carbon nanotubes may also be conducted.

This present method provides straightforward control over the depth of immersion of the carbon nanotubes within the anchoring layer. As such, a length of the carbon nanotube may protrude out from the surface of the anchoring layer. Freestanding flexible composite films of elastomer and protruding CNT arrays can be obtained by peeling off the films from their substrate, whereby they can be transferred to a separate surface or device component, eliminating the need for substrate and mounting surfaces as well as device components to be compatible with CNT fabrication processes.

The anchoring of carbon nanotube arrays improves handling during additional post-fabrication steps. Overall the present product provides robustness against accidental scraping, air blown or fluid flow rinse off and removal from the surface of a functional device. Importantly, patterns and local configurations of the original, as-grown carbon, nanotubes are preserved during the anchoring process. As such the present method is compatible with standard carbon nanotube growth patterning protocols.

In FIG. 5A a low magnification image of a 46 μm tall nanocarpet 500 anchored within an anchoring layer 510 is shown. The carbon nanotubes have been grown to form the dense nanocarpet 500. The anchoring layer 510 is a polymer plus a cross-linker composed primarily of polydimethylsiloxane (PDMS) and a platinum-containing catalyst involved in the cross linking reaction. The anchoring layer 510 is altered from a fluid to an anchoring layer 510 by actively applying heat or passively through the passage time cure. Either method results in the transformation of the polymer to a transparent silicone rubber.

In FIG. 5B a decreased magnification cross-section view of the carbon nanotube composite 520 is shown. The composite 520 is comprised of the 46 μm tall nanocarpet 530 fastened within a second silicone rubber anchoring layer 560. Using scanning electron microscopy, the second silicone rubber anchoring layer 560 was measured to be roughly 29 μm thick. Prior to altering the second anchoring layer 560 with the nanocarpet 530 therein, the primary anchoring layer 540 was applied to the glass slide 550 and altered. The thick primary anchoring layer 540 had a measured thickness of 630 μm. Once the nanocarpet 520 was surrounded by the silicone fluid layer, the silicone fluid layer was altered to form the transparent anchoring layer 540 shown. Two approaches are now presented for anchoring a nanocarpet into an Room Temperature Vulcanizing (RTV) material layer.

Figure 6B:
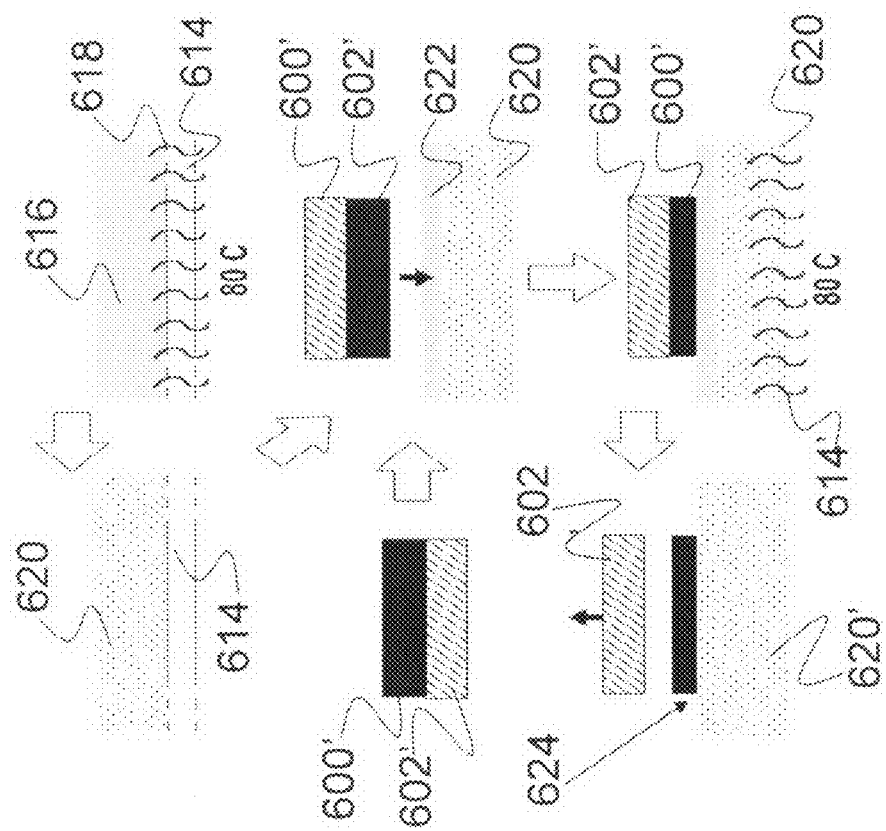
FIG. 6B is schematic representation of the formation of a carbon nanotube composite having two identical anchoring layers.
Figure 6A:
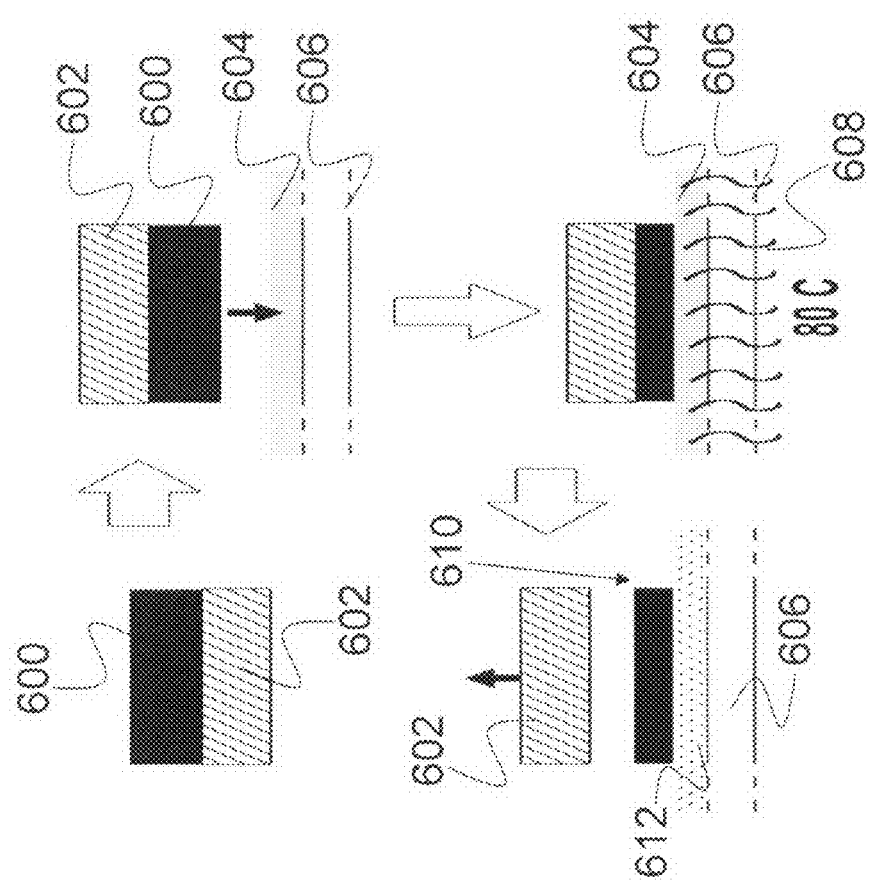
FIG. 6A is schematic representation of the formation of a single anchoring layer carbon nanotube composite.

In FIG. 6A the first approach of forming a thin layer composite 610 is shown. The thin layer composite 610 begins as a carbon nanotube array 600 attached with a supporting surface 602. The supporting surface 602 attached with the carbon nanotube array 600 is inverted, and then inserted vertically into the fluid layer 604. Inversion of the as-grown carbon nanotube array 600, which is inherent to the present method, may have additional benefits, since it is well-known that carbon nanotube arrays 600 are grown on a surface 602 and typically have closed ends as their tips or may also house catalyst particles. In general, for applications such as field emission and sensing, open ends are preferable, which inversion succeeds at providing. The fluid layer 604 which surrounds the carbon nanotube array 600, is comprised of uncured RTV material which is spin-coated onto a glass slide 606. The fluid layer 604 is altered by exposing the entire assembly to approximately 80 C heat 608, thus forming an anchoring layer 612. The anchoring layer 612 fastens the carbon nanotube array 600 within the anchoring layer 612 at the user-specified depth and thus forms the carbon nanotube composite 612. Optionally the attached supporting surface 602 may be removed from the carbon nanotube array 600. For applications in which the carbon nanotube composites 612 are further processed, handled, or shipped it is often best to abstain from removing the supporting surface 602 until necessary.

In FIG. 6B a second approach of forming a relatively thick layer carbon nanotube composite is shown. A first fluid layer 616 of RTV material is first created on a piece of Teflon material 614. The first fluid layer 616 is altered using an 80 C heat treatment 618. Once altered (or cured), the first fluid layer 616 becomes a first anchoring layer 620. A deposition of a second fluid layer 622 of uncured RTV is then placed on top of the first anchoring layer 620. A supporting surface 602 holding a carbon nanotube array 600' may then be inverted and partially immersed within the second fluid layer 622. The entire assembly is then heat cured 614' to form a single continuous anchoring layer 620'. The resulting "thick-on-thin" composite 624 is shown with the carbon nanostructure array 600' securely fastened within the newly formed two layered anchoring layer 620'. Because the thick layer 616 was cured 618 first, the carbon nanotube array 600' was partially submerged to a user-specified depth within the uncured second fluid layer 622 deposited on top of the first anchoring layer 620. Since they were composed of the same RTV material the first and second anchoring layers ensured good bonding at the interface between the two layers. Cured RTV does not adhere well to Teflon 614, which allows for easy release of the carbon nanotube composite 624. Optionally the attached supporting surface 602' may be removed from the carbon nanotube array 600'.

Figure 7B:
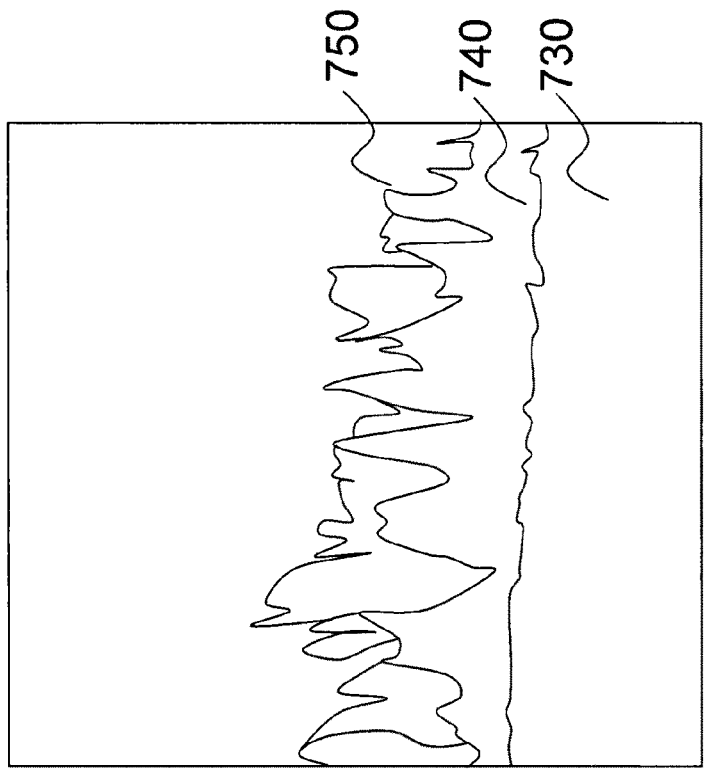
FIG. 7B is a scanning electron microscope image of a double anchoring layer carbon nanotube composite.
Figure 7A:
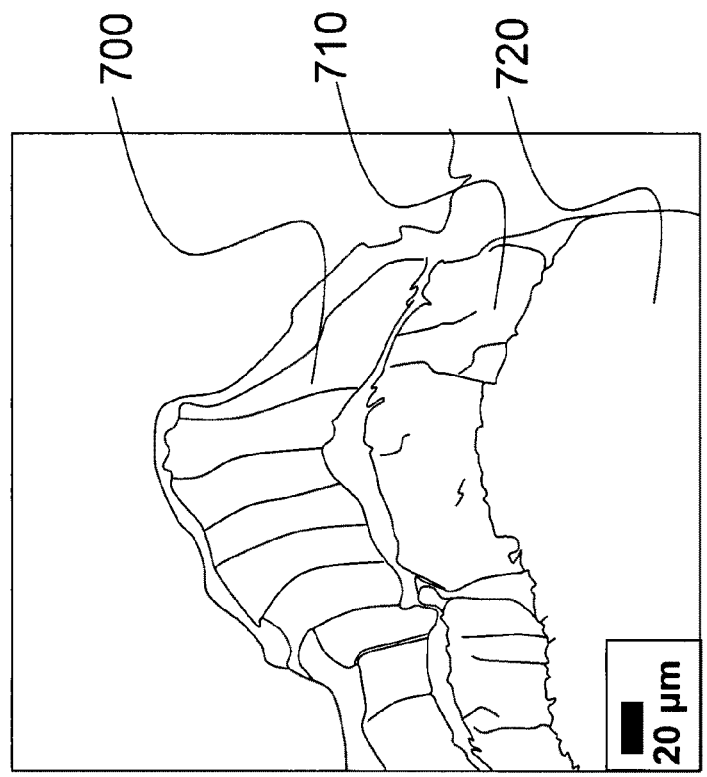
FIG. 7A is a scanning electron microscope image of a single anchoring layer carbon nanotube composite.

Referring to FIG. 7A, after spin-coating, a carbon nanotube array 700 is carefully inserted into the spun, uncured RTV fluid layer by inverting the carbon nanotube array 700 without contacting the carbon nanotubes comprising the array 700, and gently inserting the carbon nanotube array 700 into the fluid layer. No additional force is applied to the growth substrate 720 backside. The entire assembly composed of the glass slide, uncured RTV layer, nanocarpet, and growth substrate (and also the Teflon piece and double-stick tape, if used) was baked at approximately 80 C overnight. Following baking, the quartz growth substrate may be easily removed by gripping the sides using tweezers and lifting the substrate piece directly upward, releasing it from the carbon nanotube array 700 now implanted in the anchoring layer 710. The scanning electron microscope image of a cross-section of the sample, taken at a 60 degrees off-vertical tilt angle. A indicates the RTV anchoring layer, which is 30 μm thick at this location when corrected for viewing perspective, and B indicates the protruding, RTV material-free portion of the carbon nanotube 700 which is about 64 μm thick at this location when corrected for perspective. The scale bar is 20 μm.

A small portion of the RTV material was applied to the center of the secured glass slide, and spun at 2700 rpm for 2 minutes, spreading the uncured RTV material into a thin film on the glass slide. For the thin layer sample, made without the Teflon piece, sections of the cured RTV layer, far away from the carbon nanotubes array 700 implanted region, were partially released and peeled up from the glass slide using a razor and tweezers. The thickness of the RTV anchoring layer 710 was measured to be 36 μm (±2.5 μm) using a vernier thickness gauge, providing an average measurement over the gauge face area of 0.28 cm². This thickness was later confirmed in a specific location using SEM. The final result is shown in the lower portion of FIG. 7A. For the thin-on-thick layer sample made using the Teflon piece, the thickness of the first, thick layer of RTV material was 630 μm, measured by optical microscopy, and the thickness of the second, thin layer of RTV material into which the nanocarpet was anchored was 26 μm measured by SEM. This sample is shown in the lower part of FIG. 2 and in FIG. 3.

Referring to FIG. 7B, a scanning electron microscope image of a carbon nanotube array 750 is anchored in the second RTV anchoring layer 740 deposited on an already cured first RTV anchoring layer 730. The scanning electron microscope image showing the 51 μm thick nanocarpet 750 protruding from the 26 μm thick second anchoring layer 740, the carbon nanotube array 750 being partially anchored within the second anchoring layer 740. The second anchoring layer 740 is easily visible compared to the thick first RTV anchoring layer 730 underneath due to the high volume fraction of conductive carbon nanotube array 750 sufficiently disperses the charge from the incident electron beam, while the first anchoring layer 730 has no carbon nanotubes and is accumulating the charge, resulting in the low contrast shown.

The RTV anchoring layers 740 and 750 are comprised of PDMS and cross-linking agents. Just prior to use, the two components of the uncured RTV material were mixed by manual stirring at the manufacturer recommended 10:1 ratio by weight. A glass slide was first rinsed with isopropanol (IPA) and 18.2 MΩ-cm dionized water, dried with nitrogen, and secured to the bottom of a petri dish using double-stick tape. In the thin-on-thick layer approach, a 1/32 inch thick piece of Teflon material, which had also first been rinsed with isopropanol (IPA) and 18.2 MΩ-cm dionized water rinsed and nitrogen dried, was utilized to allow easy release of the RTV material once the final cure was completed. A large quantity of uncured RTV material mixture was spread over the Teflon surface, then baked at approximately 80 C. A final thin layer was then spun at 2700 rpm for 2 minutes on top of the thick, cured layer still resting on the Teflon surface, followed by nanocarpet insertion and a final bake.

Figure 8A:
FIG. 8A is a carbon nanostructure composite showing the carbon nanostructure array at an angle with respect to the growing substrate.

In FIG. 8A a carbon nanostructure composite 800 comprised of a carbon nanostructure array 820 partially submerged within an anchoring layer 810 is shown. The carbon nanostructure array 820 forms an angle with respect to the anchoring layer 810. Although the direction of the individual nanostructures within the array 810 is difficult to see in FIG. 8A, a graphical representation 830 characterizes their overall angled trend. In general nanostructures which are longer in length tend to be more uniform with respect to their overall orientation. Nanostructures shorter in length, however may have more anomalies with respect to the alignment of the nanostructure array 820 as it relates to the anchoring layer 810. Nonetheless at larger scale, an overall alignment can still be discerned.

Figure 8B:
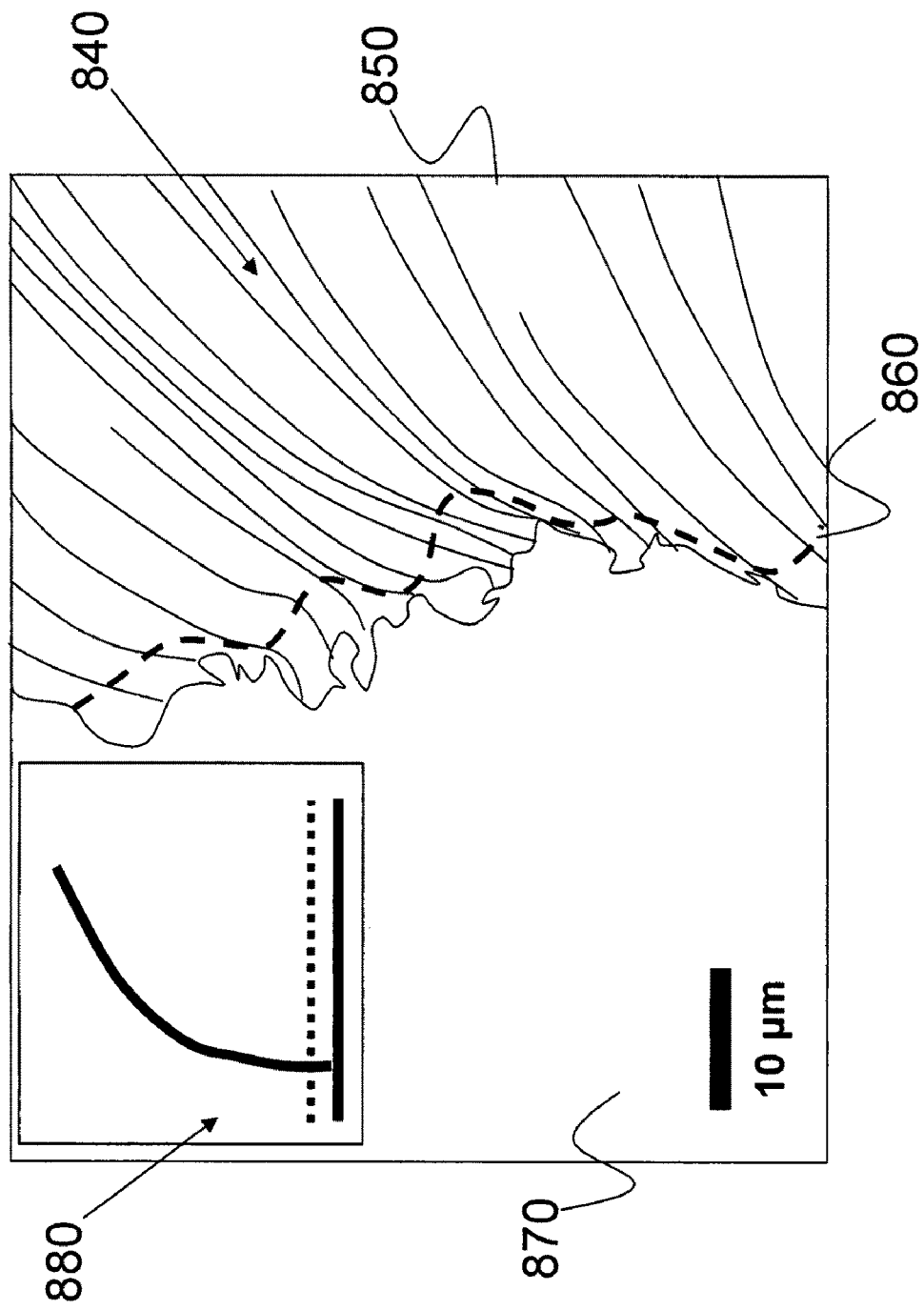
FIG. 8B is a carbon nanostructure composite showing a carbon nanostructure composite with the carbon nanotube array substantially perpendicular to the anchoring layer.

Referring to FIG. 8B, a carbon nanostructure composite 840 comprises of a carbon nanostructure array 850 shown partially submerged within an anchoring layer 870. A boundary 860 where the carbon nanostructure array 850 and the anchoring layer 870 meet is demarcated by a dashed line. The base of the carbon nanostructure array 850 is substantially perpendicular to with respect to the anchoring layer 870. A graphical representation 880 characterizes the right angle formed at the boundary 860 which begins to tilt to one side under the weight of the nanostructure array 850.

(4) DETAILED EXPERIMENTAL PROCEDURE USING PDMS AND CROSS-LINKING AGENTS

A complete, detailed experimental procedure for carrying out the method using PDMS and cross-linking agents is listed below.

The current invention is exemplified by the following procedure, and additionally extends to other embodiments using different nanostructures to be anchored, different materials for the curable layer, and different methods of curing the materials.

Prior to Applying the Method:

Thermal CVD-grown nanocarpet was fabricated in a 1 in. diameter quartz tube furnace at approximately 725 C on a quartz substrate (1 cm×1 cm×0.16 cm) pre-coated with 5 nm Fe (sputter-coated). Feedgas was ethylene and hydrogen at 4:1 ($C_2H_4$:$H_2$) ratio, and growth time was 10 min.

Experimental Acts of the Method:

Two components of uncured RTV material (RTV615, GE Silicones, Wilton, Conn.) were mixed (10:1 ratio) by manual stirring. A small, quarter-sized portion was poured onto the center of a 3"51" glass slide, which had been taped using double-stick tape (3M) to the bottom of a Petri dish. The Petri dish was spun for 2 mins., spreading the viscous uncured RTV material into a thin film on the glass slide.

Following spin-coating, the growth substrate (and the nanocarpet supported on its surface) was gently placed upside down into the thin layer of uncured RTV material, inserting a portion of the nanocarpet into the RTV layer. No additional force was applied to the growth substrate's backside.

The glass slide-RTV-nanocarpet-growth substrate assembly was baked at approximately 80 C overnight (14 hrs) to cure the RTV material fully.

Following baking, the growth substrate was easily removed by gently gripping the sides using tweezers and lifting the substrate piece directly upward. The growth substrate released from the nanocarpet, leaving the nanocarpet implanted in the cured RTV layer, with the previous "bottom" surface now as the upper surface.

Sections of the cured RTV layer far away from the nanocarpet implanted region were partially released and peeled up from the glass slide using a razor, and the thickness of the RTV layer was measured to be 36 μm using a vernier thickness gauge.

To test the strength and continuity of the cured RTV layer in the nanocarpet embedded region, tweezers were used to pull on a piece of anchored nanocarpet which was standing up from the surface.

Finally, the removed pieces of anchored nanocarpet and the remainder were characterized in SEM.

(5) CONCLUSION

The nature of the anchored nanostructures and the anchoring materials produced by the method of the current invention depend on the properties of the curable fluid, including flexibility, strength, and hardness in the cured state, optical transparency in the cured state, and viscosity, density, and nanostructure wettability in the uncured state.

Similarly the nature of the anchored nanostructures and anchoring material produced by the method of the current invention depends on the thickness of the uncured layer into which the nanostructures are inserted, resulting in control over the portion of the total length of nanostructures which protrudes from the cured material. The length of nanostructures protruding from the anchoring layer may be given by the total length of the nanostructure minus the thickness of the fluid layer into which the nanostructures are inserted.

The present invention is applicable in diverse applications in many fields, such as surface actuators, ultra-high surface area super-capacitors, electrostatically actuated surfaces, hydrodynamic drag reduction, field emission devices, transparent flexible electronics and displays, heat transfer and thermal radiators, micro-templates for biological cell growth and tissue culture, controlled active and passive fluid transport for lab-on-a-chip, and optically active surfaces. All of these in some way require a portion of the nanostructures to be free and protruding from the anchoring material, rather than fully embedded within it, in order to take advantage of the functionality of the nanostructures and allow them to be manipulated and otherwise interact with their environment.

The present invention is still further directed to a method of bringing together large numbers of pre-fabricated nanostructures and a curable material in which the preformatted nanostructures are to be anchored to a specified depth by being held at their base by the cured material when it is in its final state. This method has the very important feature of leaving a specified portion of the total original length of the nanostructures protruding from the anchoring material, and therefore available for interaction with the environment and retaining any advantageous inherent function of the nanostructures.

Figure 9B:
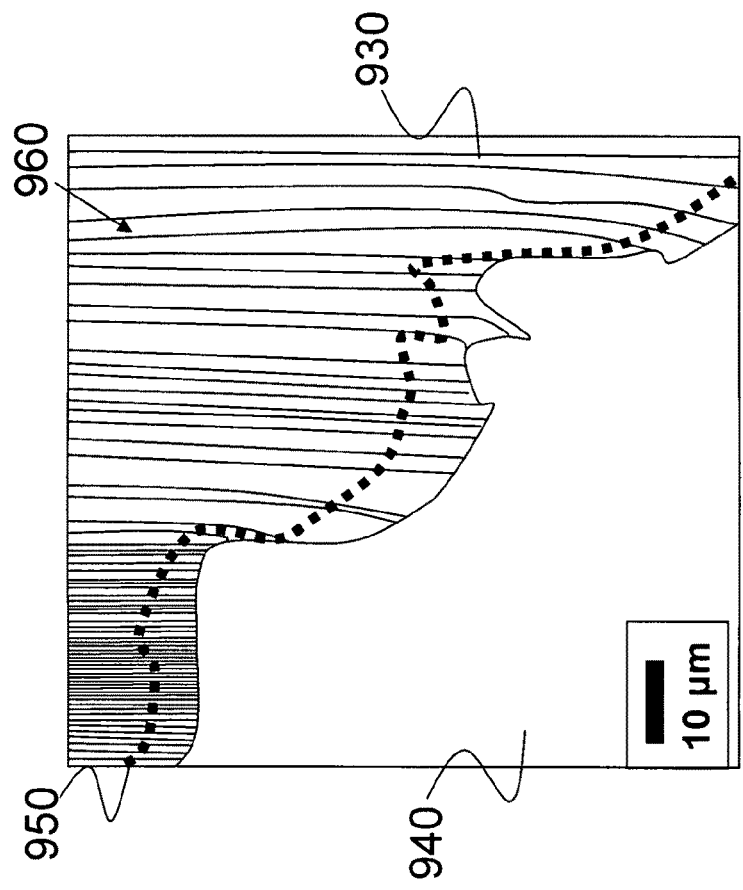
FIG. 9B is a scanning electron microscope image of an anchored carbon nanotube array.
Figure 9A:
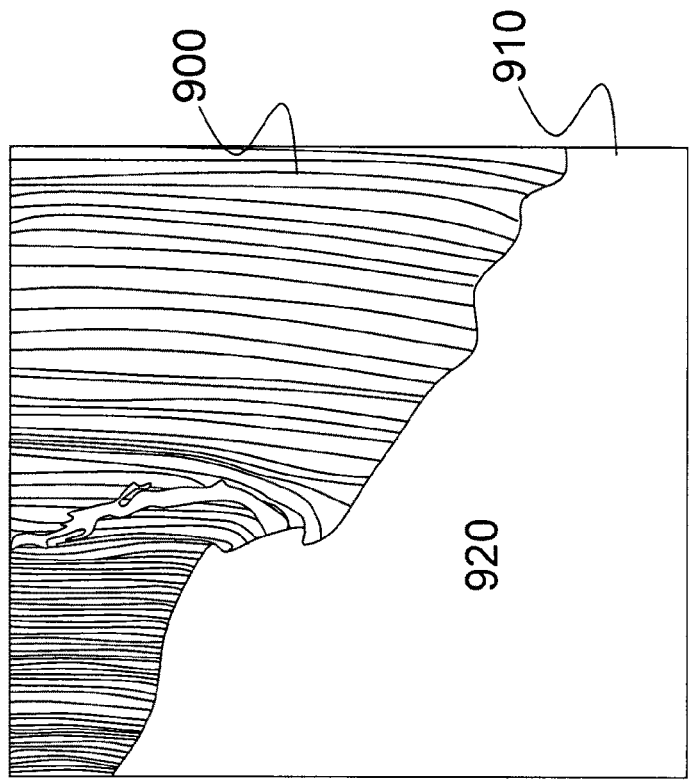
FIG. 9A is a scanning electron microscope image of an unanchored carbon nanotube array.

Referring to FIG. 9A, a SEM image of an unanchored carbon nanotube array 900 is shown. The carbon nanotube array 900 resides on a growing substrate 910. The junction 920 between the growing substrate 910 and the carbon nanotube array 900 is pronounced. PMMA is used as the anchoring material to form the carbon nanotube composite 960 shown in FIG. 9B. By inverting the carbon nanotube array 900, the inverted carbon nanotube array 930 may then be immersed and surrounded by a fluid layer. By curing the PMMA, a carbon nanotube composite 960 is formed.

Anchoring the carbon nanotube array 930 has an effect on the mechanical properties of the array. The carbon nanotube array 930 is held within the anchoring layer 940. The altered mechanics arise in part due to the anchoring of carbon nanotube array 930, but primarily as a byproduct of producing the carbon nanotube composite 960.

In order to verify that the carbon nanotubes 930 are firmly anchored within the anchoring layer 940, a friction drag reduction experiment was conducted. The carbon nanotube composite 960 was placed in a 5.5 m/s water jet impinging the carbon nanotube composite 960 at a 45 degree angle. This experiment was designed to create a realistic wall shear stress on the anchored carbon nanotube composite 960, similar to that expected for full-size ships at moderate speeds (10 knots). Though real watercraft may experience turbulent boundary layer flows at length-based Reynolds numbers of up to 1010, a power-law fit to measured wall shear stress data obtained from a turbulent boundary layer with length-based Reynolds numbers of up to $2.1 \times 10^8$ predicts a wall shear stress of between 260 and 440 dynes/cm$^2$ for 6 m/s freestream velocity. The wall shear stress caused by the 5.5 m/s impinging water jet was estimated to be 230 dynes/cm$^2$ using the classical Hiemenz flow solution for a plane stagnation flow. The optical micrographs along with visual observation, clearly indicated that no regions of the carbon nanotube composite 960 were removed from the anchoring layer 940 in which they were anchored. Thus, even at realistic levels of wall shear stress, the carbon nanotube composite 960 and the method for producing the same displayed the ability to retain the carbon nanotubes 930 within the anchoring layer 940 when exposed to a substantial shearing force.

What is claimed is:

1. A method for fastening a plurality of nanoscale structures within an anchoring layer, comprising acts of:
   providing a first fluid layer on an anchoring substrate;
   providing a plurality of nanostructures on a growth substrate on which the nanostructures were grown, the nanostructures each having a defined height and orientation with respect to the growth substrate; and
   introducing the plurality of nanostructures to a desired depth in the first fluid layer, such that the orientation of the nanostructures relative to the growth substrate is substantially maintained.

2. A method for fastening a plurality of nanoscale structures within an anchoring layer as set forth in claim 1, further comprising an act of altering the first fluid layer to form a first anchoring layer, thereby affixing at least a portion of the nanostructures within the first anchoring layer, whereby the growth substrate may be removed, leaving at least a portion of the nanostructures affixed within the substrate.

3. A method for fastening a plurality of nanoscale structures within an anchoring layer as set forth in claim 2, further comprising an act of removing the growth substrate to leave a set of nanostructures, where at least a portion of the nanostructures is affixed within the anchoring layer.

4. A method for fastening a plurality of nanoscale structures within an anchoring layer as set forth in claim 3, wherein the acts of claim 3 are performed such that a portion of the anchoring layer is nanostructure-free, the method further comprising acts of:
   an act of applying a second fluid layer of specified thickness on a portion of the anchoring layer that is nanostructure-free;
   providing a second plurality of nanostructures on a growth substrate, the nanostructures, each having a defined height and orientation with respect to the nanostructure substrate; and
   introducing the second plurality of nanostructures to a desired depth in the second fluid layer, such that the orientation of the nanostructures relative to the growth substrate is substantially maintained.

5. A method for fastening a plurality of nanoscale structures within an anchoring layer as set forth in claim 4, further comprising an act of altering the second fluid layer to form a second anchoring layer, thereby affixing at least a portion of the nanostructures within the second anchoring layer, whereby the growth substrate may be removed, leaving at least a portion of the nanostructures affixed within the substrate.

6. A method for fastening a plurality of nanoscale structures within an anchoring layer as set forth in claim 5, further comprising an act of removing the growth substrate to leave a set of nanostructures, where at least a portion of the nanostructures is affixed within the substrate.

7. A method for fastening a plurality of nanoscale structures within an anchoring layer as set forth in claim 5, wherein in the act of applying a second fluid layer, the second fluid layer is of a different material than the first fluid layer.

8. A method for fastening a plurality of nanoscale structures within an anchoring layer as set forth in claim 1, where the nanostructures are carbon nanotubes.

9. A method for fastening a plurality of nanoscale structures within an anchoring layer as set forth in claim 1, where the nanostructures are arranged in a pattern on the growth substrate.

10. A method for fastening a plurality of nanoscale structures within an anchoring layer as set forth in claim 1, where the act of providing the first fluid layer on the anchoring substrate is accomplished by spin-coating the fluid layer onto the anchoring layer to provide a substantially uniform thickness.

11. A method for fastening a plurality of nanoscale structures within an anchoring layer as set forth in claim 1, wherein the plurality of nanostructures are comprised of different materials.

12. A method for fastening a plurality of nanoscale structures within an anchoring layer as set forth in claim 1, where the first fluid layer comprises multiple fluid layers.

13. A method for fastening a plurality of nanoscale structures within an anchoring layer as set forth in claim 1, wherein the acts of claim 1 are performed such that a portion of the first fluid layer is nanostructure-free, the method further comprising acts of:

an act of applying a second fluid layer of specified thickness on a portion of the first fluid layer that is nanostructure-free;

providing a second plurality of nanostructures on a growth substrate, the nanostructures, each having a defined height and orientation with respect to the growth substrate; and introducing the second plurality of nanostructures to a desired depth in the second fluid layer, such that the orientation of the nanostructures relative to the growth substrate is substantially maintained.

* * * * *